United States Patent [19]

Yanagita

[11] Patent Number: 5,754,834
[45] Date of Patent: May 19, 1998

[54] PROGRAMMABLE RAS/CAS GENERATION CIRCUIT

[75] Inventor: Seiji Yanagita, Beppu, Japan

[73] Assignee: Texas Instruments Incorporated, Dallas, Tex.

[21] Appl. No.: 553,164

[22] Filed: Nov. 7, 1995

[30] Foreign Application Priority Data

Nov. 7, 1994 [JP] Japan ............. 6-298987

[51] Int. Cl.$^6$ ............. G06F 1/04; G06F 12/00
[52] U.S. Cl. ............. 395/551; 395/559; 395/494
[58] Field of Search ............. 395/551, 559, 395/427, 432, 438, 494

[56] References Cited

U.S. PATENT DOCUMENTS

| | | | |
|---|---|---|---|
| 5,210,856 | 5/1993 | Auvinen et al. | 395/550 |
| 5,239,639 | 8/1993 | Fischer et al. | 395/425 |
| 5,418,924 | 5/1995 | Dresser | 391/425 |

Primary Examiner—Dennis M. Butler
Attorney, Agent, or Firm—Richard L. Donaldson; William B. Kempler

[57] ABSTRACT

A circuit which increases the speed margin and reduces the circuit size of a programmable RAS/CAS generation circuit. At the beginning of the third cycle {3} in execution cycle (EX), reset signal (reset) is provided to 2-bit counter 52 along with count enable signal (cntenable) and CAS start signal (casstart). In the case of the 0 wait mode, 2-bit counter 52 is operated with count loop (0) and continues to output count value (0). Control signal generating circuit 54 makes CAS_active initially midway through the cycle (third cycle {3} during which the count output from 2-bit counter 52 has started and decodes (monitors) the count output (decode0, 1,2) from 2-bit counter 52 thereafter with wait count set data (0wait–3wait) as a parameter. In this case, the value of count output (decode0,1,2) is as is at (0), so control signal generating circuit 54 generates CAS_ of the same phase (namely, first transition and last transition occur at the same timing) by synchronizing it with system clock pulse (CLOCK).

1 Claim, 10 Drawing Sheets

EXTERNAL MEMORY INTERFACE PIN

| NAME | CONTENTS |
|---|---|
| RAS_ | ROW ADDRESS STROBE. USED WHEN THE DRAM IS USED IN THE EXTERNAL MEMORY. A HIGH LEVEL IS NORMALLY OUTPUT WHEN THE DRAM IS NOT BEING ACCESSED. |
| CAS_ | COLUMN ADDRESS STROBE. USED WHEN THE DRAM IS USED IN THE EXTERNAL MEMORY. A HIGH LEVEL IS NORMALLY OUTPUT WHEN THE DRAM IS NOT BEING ACCESSED. |
| WE_ | WRITE ENABLE. WRITE SIGNAL WITH RESPECT TO THE EXTERNAL MEMORY. A LOW LEVEL IS OUTPUT DURING DATA WRITE IN THE EXTERNAL MEMORY. |
| $EA_{11-0}$ | EXTERNAL MEMORY ADDRESS. ROW ADDRESS AND COLUMN ADDRESS ARE OUTPUT IN TIME DIVISION DURING ACCESSING OF THE EXTERNAL MEMORY. |
| $ED_{15-0}$ | EXTERNAL MEMORY DATA BUS. USED AS 16-BIT DATA BUS DURING ACCESSING OF THE EXTERNAL MEMORY. |

*FIG. 3*

EXTERNAL MEMORY CONTROL BIT

| BIT | NAME | OPERATION |
|---|---|---|
| 15-14 | EMM | EXTERNAL MEMORY ADDRESSING MODE ⋮ |
| 16 | EDW | EXTERNAL MEMORY DATA WIDTH<br>0:16 BIT/WORD<br>1:24 BIT/WORD |
| 18-17 | IOW | EXTERNAL MEMORY INTERFACE DATA BUS WIDTH<br>00:4 BIT, USES $ED_{3-0}$ AS DATA BUS (0 IS OUTPUT TO $ED_{15-4}$)<br>01:8 BIT, USES $ED_{7-0}$ AS DATA BUS (0 IS OUTPUT TO $ED_{15-8}$)<br>10:12 BIT, USES $ED_{11-0}$ AS DATA BUS (0 IS OUTPUT TO $ED_{15-12}$)<br>11:16 BIT, $ED_{15-0}$ AS DATA BUS |
| 21-19 | EMS | EXTERNAL MEMORY TYPE ⋮ |
| 23-22 | EMW | EXTERNAL MEMORY WAIT STATE COUNT<br>00: NO WAIT<br>01: 1 WAIT<br>10: 2 WAITS<br>11: 3 WAITS |

*FIG. 4*

(ACCESS FREQUENCY NECESSARY FOR WRITING/READING OF 1 WORD)

| EDW | IOW | DATA WIDTH | DATA BUS WIDTH | ACCESS FREQUENCY |
|---|---|---|---|---|
| 0 | 00 | 16-BIT | 4-BIT | 4 |
| 0 | 01 | 16-BIT | 8-BIT | 2 |
| 0 | 10 | 16-BIT | 12-BIT | N/A |
| 0 | 11 | 16-BIT | 16-BIT | 1 |
| 1 | 00 | 24-BIT | 4-BIT | 6 |
| 1 | 01 | 24-BIT | 8-BIT | 3 |
| 1 | 10 | 24-BIT | 12-BIT | 2 |
| 1 | 11 | 24-BIT | 16-BIT | N/A |

FIG. 5

(1) 0 WAIT
```
ACCESS FREQUENCY   1   2   3   4   6
R/W CYCLE TIME     3   4   5   6   8
```
(2) 1 WAIT
```
ACCESS FREQUENCY   1   2   3   4   6
R/W CYCLE TIME     4   5   7   8   11
```
(3) 2 WAITS
```
ACCESS FREQUENCY   1   2   3   4   6
R/W CYCLE TIME     5   7   9   11  15
```
(4) 3 WAITS
```
ACCESS FREQUENCY   1   2   3   4   6
R/W CYCLE TIME     5   8   11  14  20
```
FIG. 6

(1 WAIT/3 ACCESS FREQUENCY)
```
  * WRE        * RDE
  1 NOP1       1 NOP1
  2 NOP1       2 NOP1
  3 NOP1       3 NOP1
  4 NOP1       4 NOP1
  5 NOP1       5 NOP1
  6 NOP1       6 NOP1
  7 WRE        7 RDE
```
FIG. 7

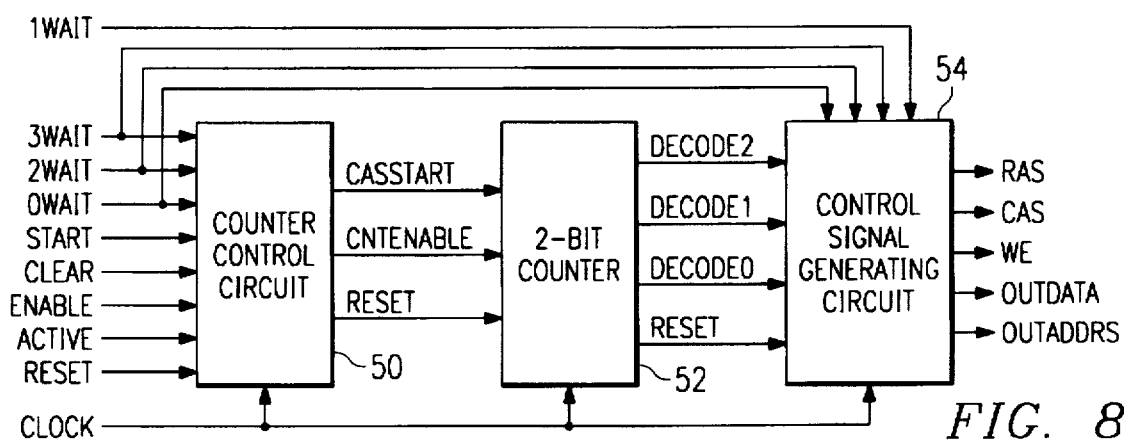

FIG. 8

PROGRAMMABLE RAS/CAS GENERATION CIRCUIT

FIELD OF THE INVENTION

My invention pertains to a RAS/CAS generation circuit for creating RAS and CAS signals for memory access of a DRAM.

When a CPU or a memory controller accesses a memory for writing or reading, the data is transferred on the data bus by being divided a number of times when the width of the data to be exchanged between the two parts is larger than the width of the data bus connecting them. If the memory is a DRAM (dynamic RAM), this type of division type data writing/reading is often executed by the page mode. Page mode is a memory access system which cyclically activates CAS (column address strobe signal) a number of times while leaving RAS (row address strobe signal) active, and the column address information is strobed and the data is latched every time CAS is activated.

A conventional programmable RAS/CAS generating circuit which generates RAS/CAS in the page mode is shown in FIG. 14. This RAS/CAS generation circuit includes an external memory interface circuit which executes writing or reading of data by accessing an external auxiliary memory (DRAM) for expanding the memory space in, for example, a DSP (digital signal processor).

This RAS/CAS generation circuit is comprised of a 5-bit counter (or $2^5$ counter) 100, timing decoder 102, and control signal generating circuit 104.

Along with feeding system clock pulses (CLOCK) to 5-bit counter 100 from clock circuit (not shown in the FIG.), active signal (active), start signal (start), clear signal (clear), and reset signal (reset) are fed from a control circuit (not shown in the FIG.). The 5-bit counter 100 counts clock pulses (CLOCK) under the control of the active signal (active), start signal (start), clear signal (clear), and reset signal (reset), and provides count output (out 0–4) of 5 bits to timing decoder 102.

Count output (out 0–4) from 5-bit counter 100, the system clock pulse (CLOCK) from the clock circuit, the reset signal (reset) from the control circuit, wait count set data (0wait–3wait) which specifies the number of waits state (wait count), and access set data (access cnt 1–6) which specifies the number of times page mode access is fed to timing decoder 102. Here, the wait state is the wait time inserted in the execution cycle for memory access in order for the pertinent external memory interface circuit to wait for the data to be determined on the pertinent DRAM side in which the processing speed is slower. Wait count set data (0wait–3wait) is 4-bit data which specifies 4waits 0–3 in this example, and the bit in each column corresponds to each specified wait. For example, when specifying 1wait (one wait state), the second least significant bit (digit) 1wait has a logic value of 1 and bits of other digits 0wait, 2wait, 3wait all have a logic value of 0.

Page mode access indicates each access when one piece of data is written or read by being divided a number of times according to the page mode and the frequency of page mode access corresponds to the frequency at which CAS is activated. Access frequency set data (access cnt 1–6) is data specifying the access frequency within the range of 1–6 times in this example, the bit in each digit can be data of 6 bits corresponding to each specified access frequency or it can be a binary code of 3 bits.

Timing decoder 102 decodes count output (out 0–4) from 5-bit counter 100 for each clock cycle with the wait count set data (0wait–3wait) and access frequency set data (access cnt 1–6) as condition data (parameter) and provides the decoded output to control signal generating circuit 104.

Control signal generating circuit 104 inputs the wait count set data (0wait–3wait) as a parameter and creates various control signals, namely, RAS__, CAS__, WE__ (write enable signal), OUTDATA (internal data input/output control signal), and OUTADDRS (internal address output control signal) for memory access in accordance with the decoded output from timing decoder 102.

Here, WE__ is the control signal for placing the pertinent DRAM in the write/read mode, OUTDATA is the control signal for specifying transmission or reception of data to the data transmission/reception part (not shown in the FIG.) within the pertinent external memory interface circuit, and OUTADDR is the control signal for specifying transmission of address information to the address output part (not shown in the FIG.) within the pertinent external memory interface circuit.

Operation of the programmable RAS/CAS generation circuit in write memory access will be explained with reference to FIGS. 15 and 16. FIG. 15 shows the memory access operation when the wait count is 0 and the access frequency is 4 and FIG. 16 shows the memory access operation when the wait count is 1 and the access frequency is 3.

When the wait count and access frequency are provided, for example, when the wait count is 0 and access frequency is 4, the length (cycle time) of the execution cycle is 7 cycles, and when the wait count is 1 and access frequency is 3, the cycle time is 6 cycles. When a write/read instruction is to be executed, 1 cycle is allotted respectively to fetch cycle (F), first and second decode cycles (D1,D2), and operand cycle (OP), and a number of cycles corresponding to the cycle time is allotted to execution cycle (EX) (7 cycles in the case of FIG. 15 and 6 cycles in the case of FIG. 16).

When execution cycle (EX) is started, start signal (count start control signal) (start) enters counter 100 and counter 100 starts counting clock pulses (CLOCK). Thereafter, counter 100 outputs count values 0–4 (0, 1, 2, . . . ) for each clock cycle. Timing decoder 102 decodes the counter output which increments at each clock cycle, and control signal generating circuit 104 controls the logic level of control signals RAS__, CAS__, WE__, OUTDATA, and OUTADDRS according to each decoded output.

In the case of FIG. 15, row address information (Row) is output from the address terminal of address output circuit by making OUTADDRS active at the same time to write enable signal WE__ is made active (L level) at the start of second cycle {2} of execution cycle (EX), RAS is made active (L level) in the middle of the second cycle {2}, and with this, row address information (Row) is placed in the DRAM. Thereafter, write enable signal WE__ and RAS__ are kept in the active state (L level) until memory access is completed.

After the third cycle {3} of execution cycle (EX), CAS__ is made active (L level) for each cycle, and in sync with this, column address information (COL), which specifies the column address of each divided data for each cycle from the address terminal, is output, and each divided data (Data) is output for each cycle from the data terminal of the data transmission/receiving circuit.

In the case of FIG. 16, the operation of first and second cycles {1} and {2} of execution cycle (EX) is the same as in the case of FIG. 15 and control of write enable signal WE__ and RAS__ is the same for the entire memory access period, but control of CAS__ after the third cycle {3} differs.

3

Namely, CAS__ is made active (L level) every 1.5 cycles and in synch with this CAS__, column address information (COL) specifying the column address of each divided data is output every 1.5 cycles from the address terminal, and each divided data (Data) is output every 1.5 cycles from the data terminal of data transmission/receiving circuit.

The page mode access operation shown in FIGS. 15 and 16 is one example and when the wait count or access frequency changes, the length (cycle time) of execution cycle changes and the cycle/frequency at which CAS__ becomes active changes. In this RAS/CAS generation circuit, the cycle time of the execution cycle can be set at a maximum within a range of 1–32 since counter 100 is a $2^5$ counter.

In the conventional programmable RAS/CAS generation circuit, the cycle/frequency for making CAS__ active is controlled by timing decoder 102 decoding count output (out 0–4) from 5-bit counter 100 for each clock cycle with wait count set data (0wait–3wait) and access frequency set data (access cnt 1–6) as the parameters.

The problem with this type of conventional circuit is that the circuit scale of timing decoder 102 is very large. For example, if there are four wait count of 0–3, six access frequencies of 1–6, and the cycle time of execution can be set to a maximum of 22 cycles (namely, count output (out 0–4) changes within a range of 0–21), a combination logic circuit which can set the first transition and last transition timing of 4×6×22 RAS__ and CAS__ is needed in timing decoder 102. This problem becomes more noticeable as the range of possible values increases for each parameter (wait count, access frequency, cycle time).

Furthermore, as the circuit scale of timing decoder 102 becomes large as noted above, the length of the signal propagation time or internal bus for generating output signals (in particular, CAS__) becomes long, thus there was the problem in that securing a speed margin with respect to the specifications of the pertinent DRAM became difficult.

My invention was made taking the conventional problems into consideration and it aims to provide a programmable RAS/CAS generation circuit which makes the speed margin large and reduces the circuit scale.

SUMMARY OF INVENTION

The programmable RAS/CAS generation circuit of my invention has a wait count setting circuit for setting the number of waits in the memory access, a counter which counts a prescribed clock pulse in a program controllable count loop, a count loop controlling circuit which program controls the count loop of the counter according to the number of waits set by the wait count setting circuit, a count start timing controlling circuit which controls the timing of the count start in the counter according to the wait count set by the wait count setting circuit, a RAS generation circuit which keeps the logic level of the RAS in the active state during the memory access, and a CAS generation circuit which controls the logic level of the CAS during the memory access according to the output of the counter and the number of waits set by the wait count setting circuit, in a programmable RAS/CAS generation circuit which repeats and makes CAS (column address strobe signal) active by a prescribed frequency at the preset cycle with the RAS (row address strobe signal) left in the active state for memory access of a given DRAM (dynamic RAM).

In the structure, the counter begins the count operation at a time complying with the number of waits under the control of count start timing controlling circuit and repeats the count operation with a count loop complying with the wait count under the control of the count loop controlling circuit. The CAS generation circuit controls the waveform or logic of CAS according to the output of the counter and the number of waits. Therefore, CAS repeats the same waveform or phase at the cycle corresponding to the cycle of the count loop until memory access ends.

BRIEF DESCRIPTION OF THE DRAWINGS

FIG. 3 is a table showing the function of the external memory (DRAM) in af ace pin provided to EX-IF 22 in the embodiment.

FIG. 4 is a table showing the function of the principal bits of external memory control data CR3 provided to timing control unit 40 within EX-IF 22 in the embodiment.

FIG. 5 is a table showing an example of access frequency determination method for page mode access in the embodiment.

FIG. 6 is a table showing the cycle time in each case when the wait count and access frequency are varied in the embodiment.

FIG. 7 is FIG. for explaining the meaning of the cycle time in the embodiment.

FIG. 8 is a block diagram showing the configuration of the programmable RAS__/CAS__ generation circuit according to the embodiment.

In the FIGURES, 10 represents the C-BUS, 12 the D-BUS, 14 the G-BUS, 22 the EX-IF (external memory input/output interface circuit), 30 the controller, 40 the timing control unit, 42 the address control unit, 44 the data control unit, 50 the counter control circuit, 52 the 2-bit counter, and 54 represents the control signal generating circuit.

DETAILED DESCRIPTION

Figure 1:
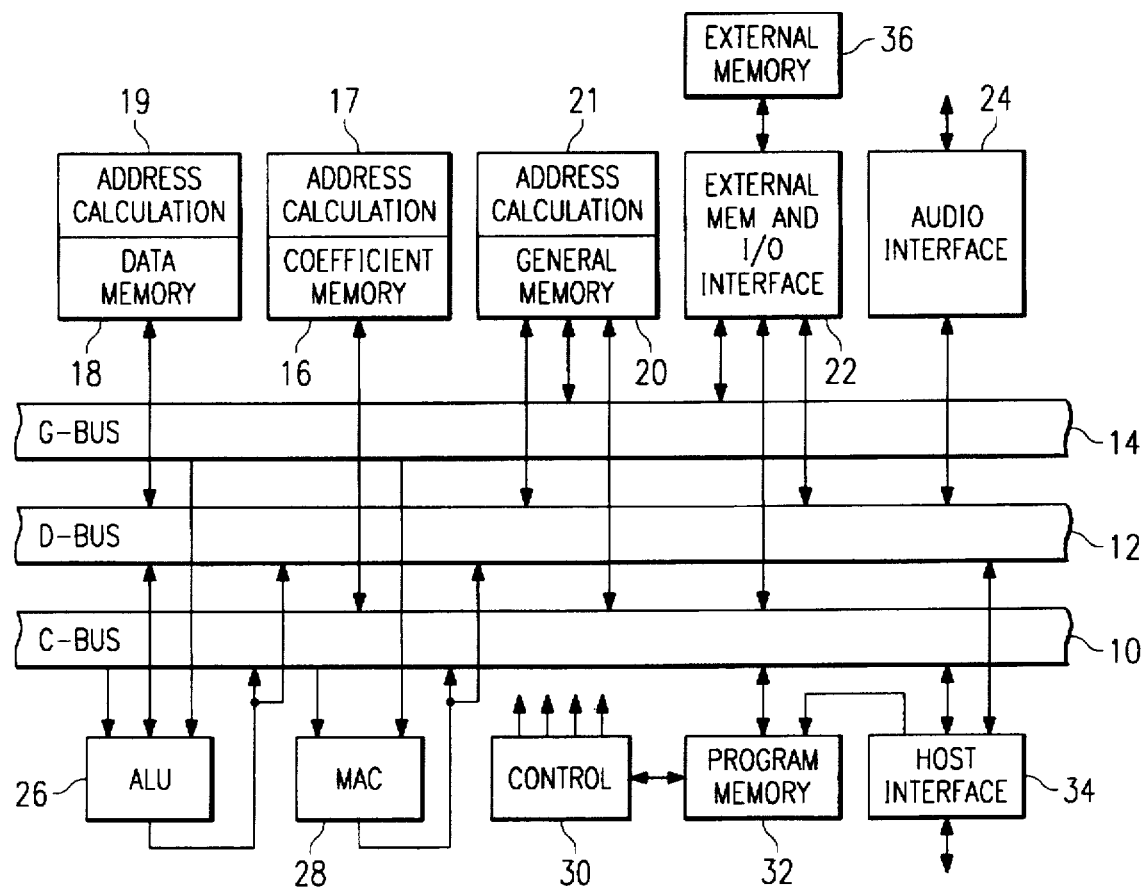
FIG. 1 is a block diagram showing the system structure of an audio digital signal processing DSP which includes a programmable RAS/CAS generation circuit according to one embodiment of my invention.

An embodiment of my invention will be explained with reference to FIGS. 1-13. FIG. 1 indicates a system structure of a DSP for audio digital signal processing including a programmable RAS/CAS generation circuit according to one embodiment of my invention. This DSP system has three mutually independent data buses (C-BUS 10, D-BUS 12, G-BUS 14) each with a data bus width of 24 bits and each part is connected to the buses as indicated in the FIG.

A coefficient memory (C-MEM) 16, a general-use memory (G-MEM) 20, an external memory input/output interface circuit (EX-IF) 22, arithmetic logic unit (ALU) 26, a sum-of-products computer (MAC) 28, a program memory (P-MEM) 32, and a host interface circuit (HOST-IF) 34 are connected to a C-BUS 10.

A data memory (D-MEM) 18, general-use memory (G-MEM) 20, external memory input/output interface circuit (EX-IF) 22, audio interface circuit (AU-IF) 24, arithmetic logic unit (ALU), 26, sum-of-products computer (MAC) 28, and host interface circuit (HOST-IF) 34 are connected to D-BUS 12.

General-use memory (G-MEM) 20, external memory input/output interface circuit (EX-IF) 22, and arithmetic logic unit (ALU) 26 are connected to G-BUS 14.

C-MEM 16, D-MEM 18, and G-MEM 20 are each composed of an SRAM (static RAM) having a memory capacity of 256×24 bits. Along with coefficient data for sum-of-products arithmetic operations being mainly stored in C-MEM 16, address information for accessing an external memory (not shown in the FIG.) connected to EX-IF 22 is also stored. Data (mainly audio data) used for sum-of-products arithmetic operations and other arithmetics and arithmetic results data are stored in D-MEM 18.

G-MEM 20 is normally used as an extension memory for D-MEM 18. When handling a large volume of delay data, such as sound field reproduction, etc., delay data which cannot fit in D-MEM 18 is stored in an external memory composed of DRAM and the delay data is incorporated into G-MEM 20 from the external memory with a prescribed instruction (background external memory readout instruction) when necessary. In this case, address information for accessing the external memory is also stored in G-MEM 20. G-MEM 20 can also be used as an extension memory of C-MEM 16 and can store coefficient data as needed.

Addressing units 17, 19, and 21 are respectively appended to C-MEM 16, D-MEM 18, and G-MEM 20 for executing address calculation.

EX-IF 22 is also connected to external memory (DRAM) 36 for the delay data storage, has a memory control function which can execute writing and reading of data by accessing the external memory, and has a built-in programmable RAS/CAS generation circuit according to the embodiment.

AU-IF 24 is an interface circuit for executing exchange of data between the DSP and external digital audio circuit and, for example, it is connected to CD playback circuit in the previous step and digital filter or D/A converter in the next step. When audio signals (data) are input from external circuit, an interrupt is applied to controller 30 to be discussed later when one data item is completed in the register within AU-IF 24 and the data is stored in D-MEM 18 via D-BUS 12 by interrupt processing.

ALU 26 is a computer which executes an optional arithmetic calculation and logic calculation and also has a built-in accumulator. MAC 28 is a computer which executes dedicated sum-of-products arithmetic operations and has a built-in multiplier and accumulator. Two computers (ALU 26 and MAC 28) are thus provided, so parallel processing, for example, executing convolution in MAC 28 while executing addition in ALU 26, is possible.

P-MEM 32 is composed of an SRAM having a memory capacity of, for example, 512×32 bits and is stored with a program which regulates the processing operation of the DSP. Control circuit 30 successively reads the instruction codes from P-MEM 32, controls the registers and gates (not shown in the FIG.) within the system by the PLA (program logic array) system, and functions such that each part executes the pertinent instruction. The control bus is not shown in FIG. 1 for convenience in the explanation.

HOST-IF 34 is an interface circuit which exchanges control signals and data between the DSP and host controller 36. C-BUS 10 and D-BUS 12 are connected by circuit of a parallel port, and HOST-IF is connected to host controller 36 by circuit of a serial port. The program data stored in P-MEM 32, coefficient data and address information stored in C-MEM 16, and address information stored in G-MEM 20 are provided from host controller 36 and downloaded to each memory via HOST-IF 34 via C-BUS 10.

Figure 2:
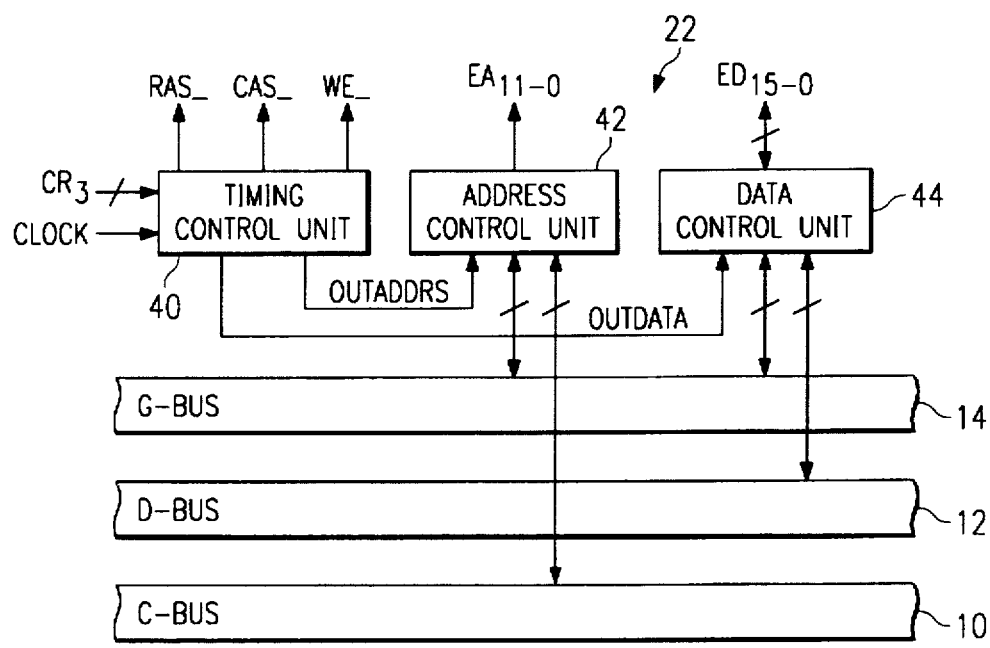
FIG. 2 is a block diagram showing a circuit configuration on the inside part of external memory input/output interface circuit (EX-IF) 22 included in the DSP of FIG. 1.

As shown in FIG. 2, EX-IF 22 is comprised of timing control unit 40, address control unit 42, and data control unit 44. FIG. 3 shows the function of the external memory (DRAM) interface pin provided to EX-IF 22.

Timing control unit 40 inputs clock pulse (CLOCK) from clock circuit (not shown in the FIG.) along with inputting external memory control data CR3 from a prescribed register (not shown in the FIG.) within controller 30, and along with transmitting control signals RAS__, CAS__, and WE__ to external memory 36 during memory access with respect to external memory 36, provides address output control signal OUTADDRS and data input/output control signal OUTDATA respectively to internal address control unit 42 and data control unit 44. The programmable RAS/CAS generation circuit according to the embodiment is built into the timing control unit 40.

Address control unit 42 operates to input address information of 24 bits from C-BUS 10 or G-BUS 14 during the memory access (reading/writing) with respect to external memory 36, store this in internal address register EXA, and separate the address information into row address information and column address information with 12 bits each in response to the address output control signal (OUTADDRS) from timing control unit 40 and transmits it to external memory 36 from external memory address pin (EA11-0) in time division. With respect to external memory 36, column address information is transmitted repeatedly a number of times cyclically by synchronizing with the timing of CAS__ to execute memory access in the page mode.

Data control unit 44 operates to input data of 16 bits or 24 bits from D-MEM 18 and G-MEM 20 via D-BUS 12 and G-BUS 14 during writing of data with respect to external memory 36, store the input data into external writing data register EXW, and transmit the data to external memory 36 from external memory data pin ED15-0 in response to the data input/output control signal (OUTDATA) from timing control unit 40.

Also, data control unit 44 receives data from external memory 36 in response to data input/output control signal (OUTDATA) from timing control unit 40 and stores it in internal readout data buffer EXR during the reading of data from external memory 36. Then, the data stored in data buffer EXR is transmitted to D-MEM 18 or G-MEM 20 via D-BUS 12 or G-BUS 14 during the next readout.

With respect to external memory 36, to execute memory access in the page mode, the data is divided a number of times between data control unit 44 and external memory 36 and each divided data item is transmitted by being synchronized with the timing of CAS_.

FIG. 4 shows the principal bit function of external memory control data CR3 provided to timing control unit 40 from controller 30. The external memory wait count is set according to pertinent external memory 36 in most significant EMW bits (23–22) in the data CR3. In this example, setting of four waits (no wait, 1 wait, 2 waits, 3 waits) is possible.

In EMS bits (21–19), the type of pertinent external memory 36 is set. For example, if pertinent external memory 36 is 256 K×n-bit DRAM, 000 is set in EMS (21–19) and if it is 1 M×n-bit DRAM, 001 is set in EMS (21–19).

In IOW bit (18–17), the data bus width (external memory interface data bus width) between EX-IF 22 and pertinent external memory 36 is set. In this example, four data bus widths (4 bits, 8 bits, 12 bits, 16 bits) can be set.

In EDW bit (16), the width (external memory data width) of the data written/read in pertinent external memory 36 is set. In this example, a data width of 1 word can be selected as 16 bits or 24 bits. 0 is set in EDW when it has a width 16 bits, and 1 is set in EDW when it has a width of 24 bits.

In EMW bit (15–14), the mode (external memory addressing mode) for addressing with respect to pertinent external memory 36 is set. For example, when executing circular addressing, 00 is set in EMW bits (15–14) and 10 is set in EMW bits (15–14) when executing linear addressing.

When the data bus width and data width between pertinent memory 36 and EX-IF 22 are set by the EDW bit and IOW bit of external memory control data CR3 as noted above, as shown in FIG. 5, the access frequency of page mode access with respect to pertinent memory 36 is obtained for each case from the set values. For example, if the data width is 16 bits and the data bus width is 4 bits, 16-bit data is divided into four 4-bit data units and is transmitted on 4-bit data bus after being divided into four parts.

From the access frequency and EMW bit which specifies the number of waits obtained thusly, the length (R/W cycle time) of an execution cycle for memory access (write/read) regarding each case is determined as shown in FIG. 6.

For example, if the wait count is 1 and access frequency is 3, the R/W cycle time has 7 cycles. This circuit that when external memory write instruction (WRE) or external memory read instruction (RDE) is executed repeatedly, a NOP (No OPeration) instruction indicating nonexecution of the instruction is provided to the next instruction for each cycle during the first to sixth cycles of the execution cycle for the pertinent instruction, and begins the execution cycle of the next instruction at the seventh cycle.

FIG. 8 shows the configuration of the programmable RAS/CAS generation circuit in the embodiment. As noted above, this circuit is built into timing control unit 40.

This programmable RAS/CAS generation circuit is comprised of counter control circuit 50, 2-bit counter (or $2^2$ counter) 52, and control signal generating circuit 54.

System clock pulse (CLOCK), wait count set data (0 wait–3 wait), start signal (start), clear signal (clear), enable signal (enable), active signal (active), and reset signal (reset) are input into counter control circuit 50. During the data or signals, the system clock pulse (CLOCK) is fed from the clock circuit and remaining (0 wait–3 wait), (start), (clear), (enable), (active), and (reset) are fed from the control circuit (not shown in the FIG.) within timing control unit 40 which inputs external memory control data CR3 from controller 30.

The system clock pulse CLOCK, CAS start signal (casstart) from counter control circuit 50, counter enable signal (cntenable), and reset signal (reset) are input to 2-bit counter 52. The 2-bit counter 52 counts system clock pulse CLOCK with one of three types of count loops (0), (0,1), and (0,1,2) according to the control signals (casstart), (cntenable), and (reset), and generates 3 bit count output (decode0,1,2) and reset signal (reset).

Control signal generating circuit 54 inputs wait count set data (0 wait–3 wait) as a parameter and generates various control signals for memory access, namely, RAS_, CAS_, WE_, OUTDATA, and OUTADDRS by responding to count output (decode0,1,2) from 2-bit counter 54.

Figure 9:
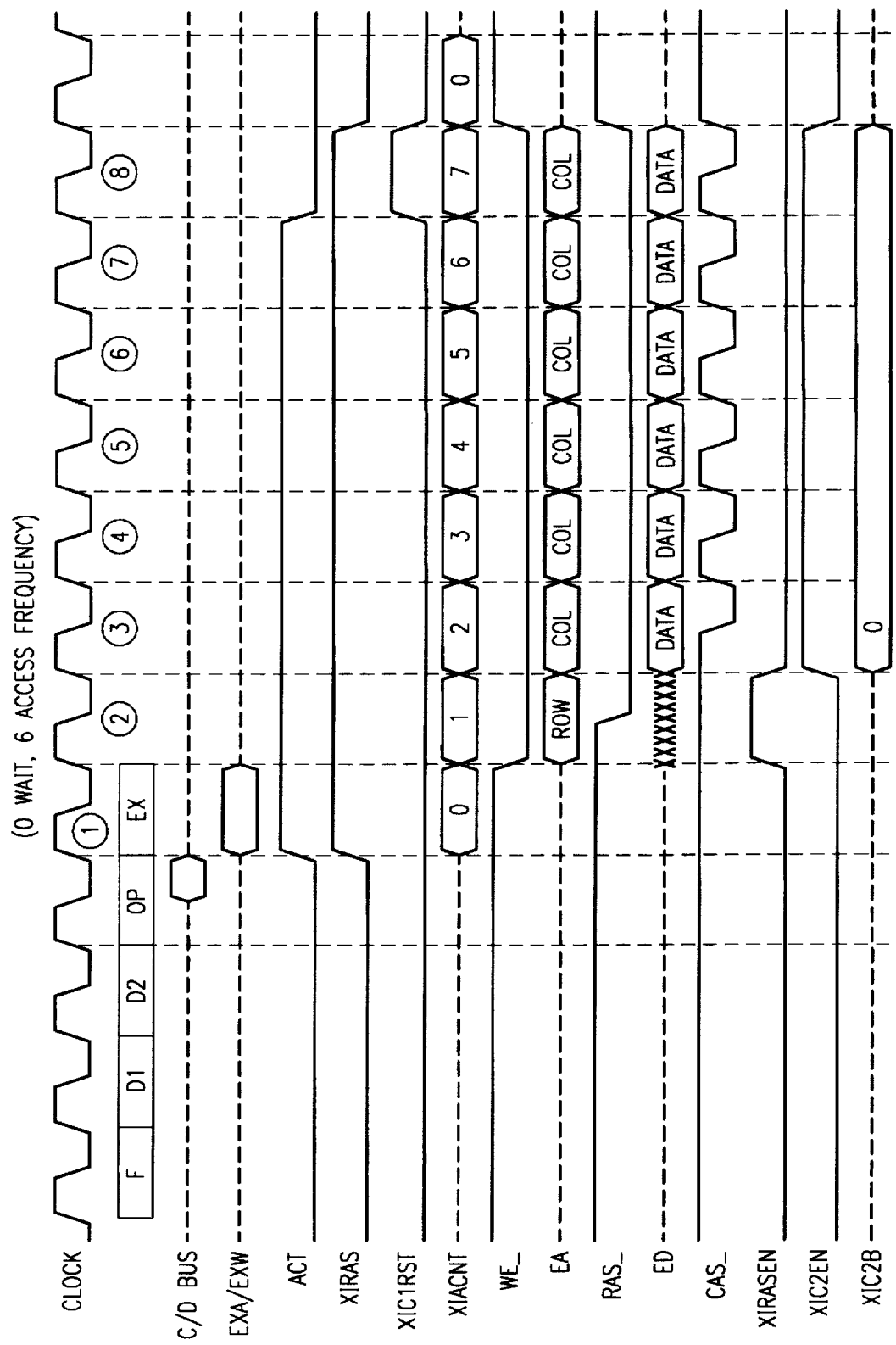
FIG. 9 is a timing chart showing the waveform or signal state of each part when write memory access is executed with (0wait, 6 access frequency) in the embodiment.
Figure 10:
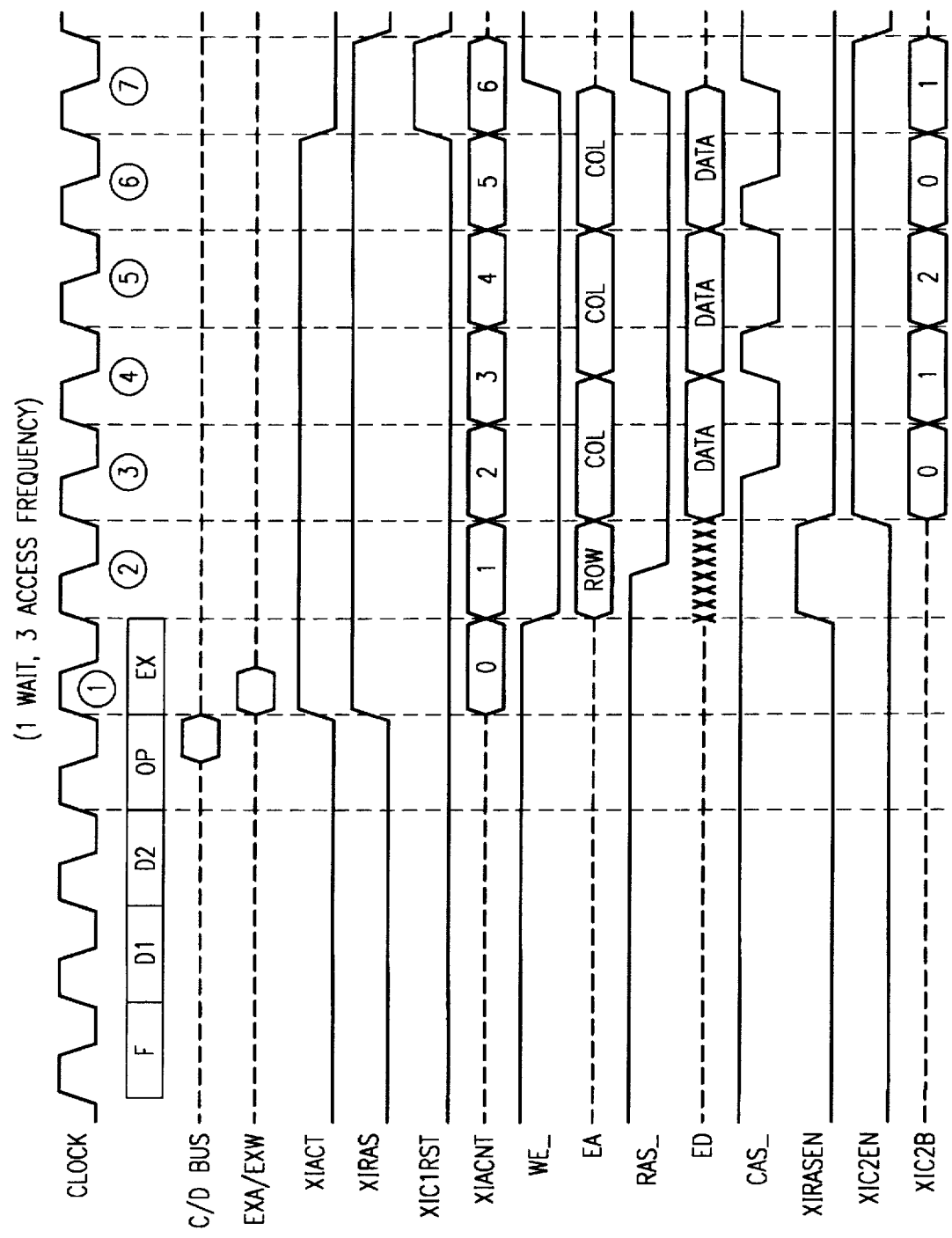
FIG. 10 is a timing chart showing the waveform or signal state of each part when write memory access is executed with (1 wait, 3 access frequency).
Figure 11:
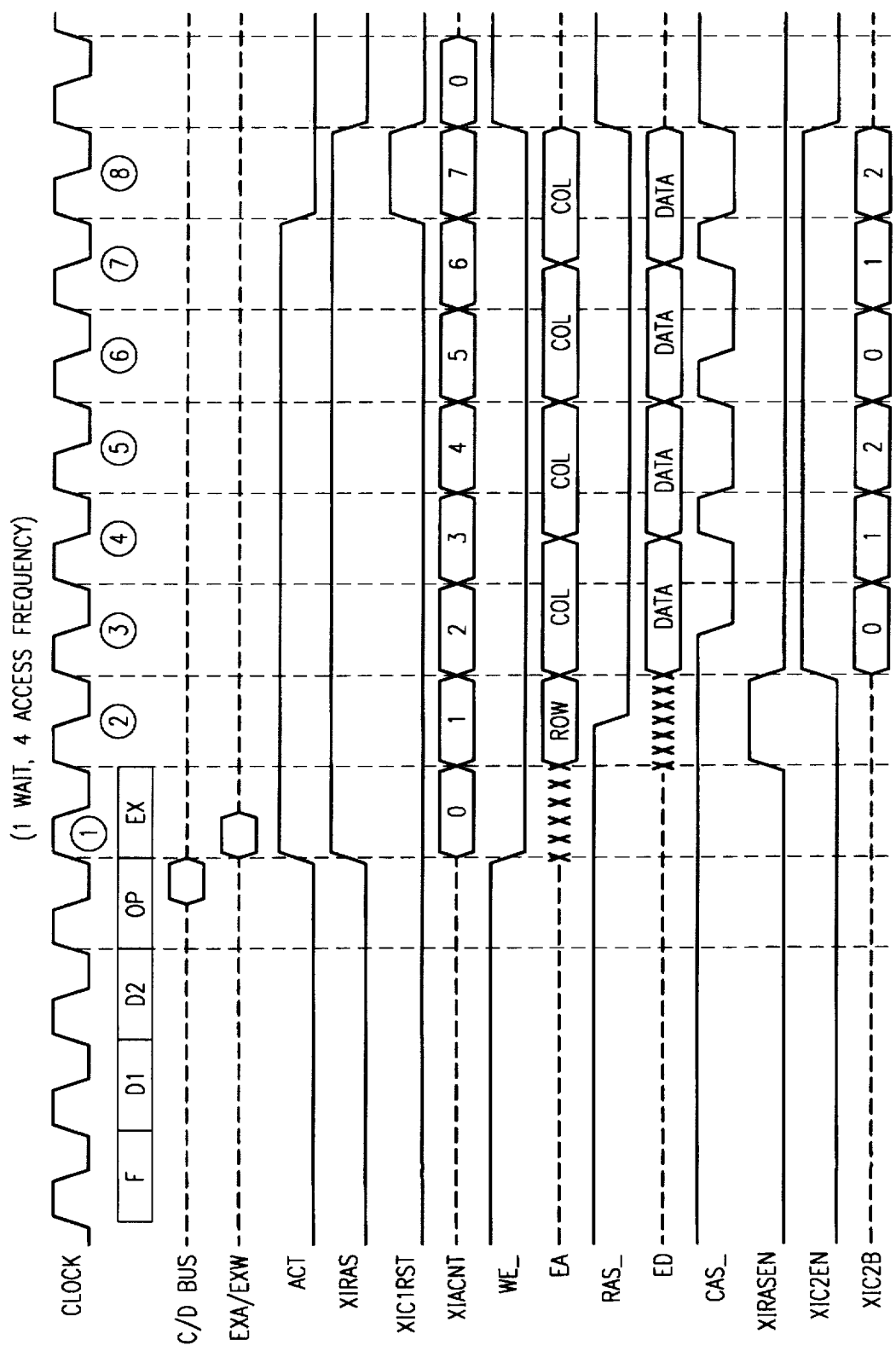
FIG. 11 is a timing chart showing the waveform or signal state of each part when write memory access is executed with (1 wait, 4 access frequency) in the embodiment.
Figure 12:
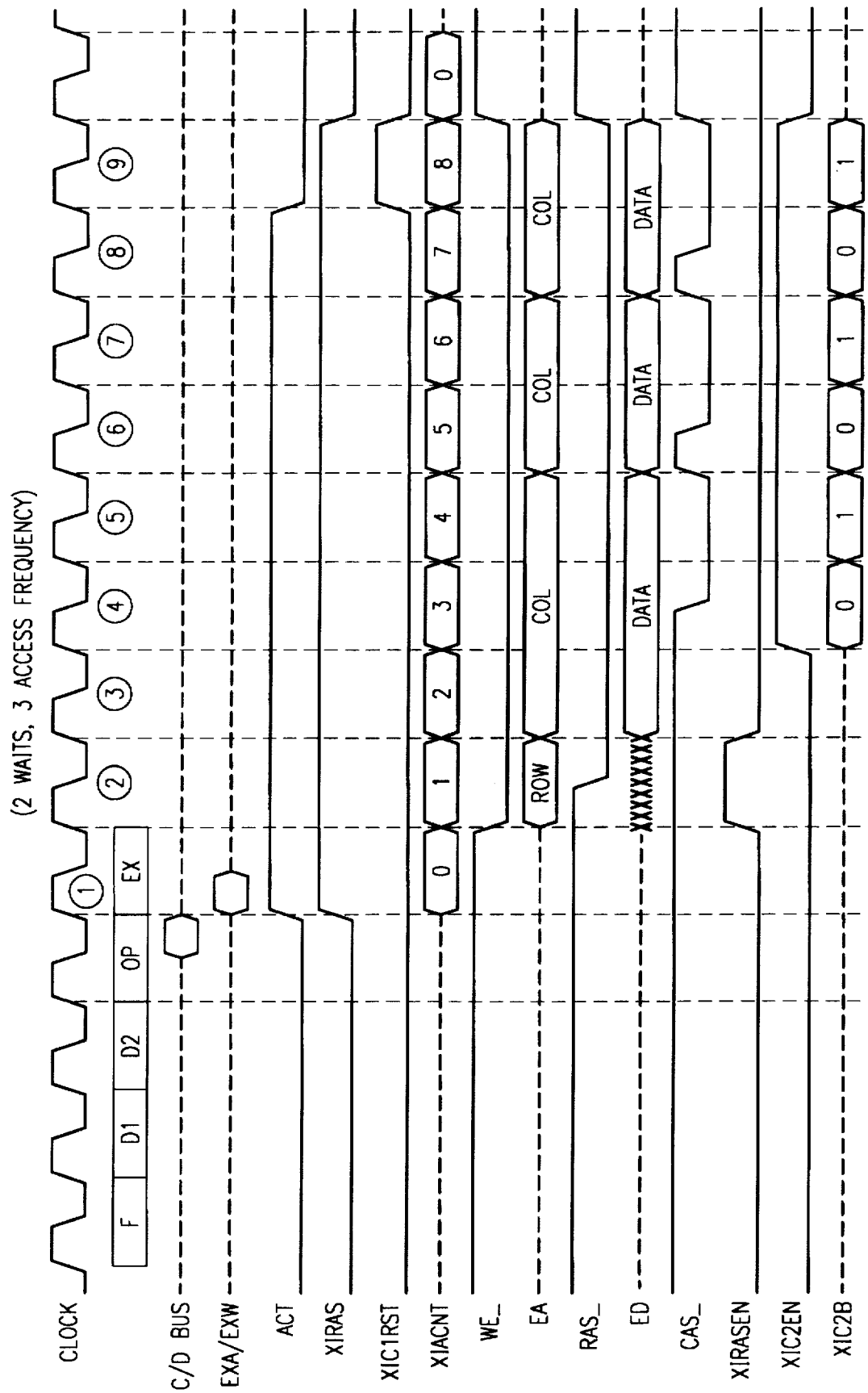
FIG. 12 is a timing chart showing the waveform or signal state of each part when write memory access is executed with (2 wait, 3 access frequency) in the embodiment.
Figure 13:
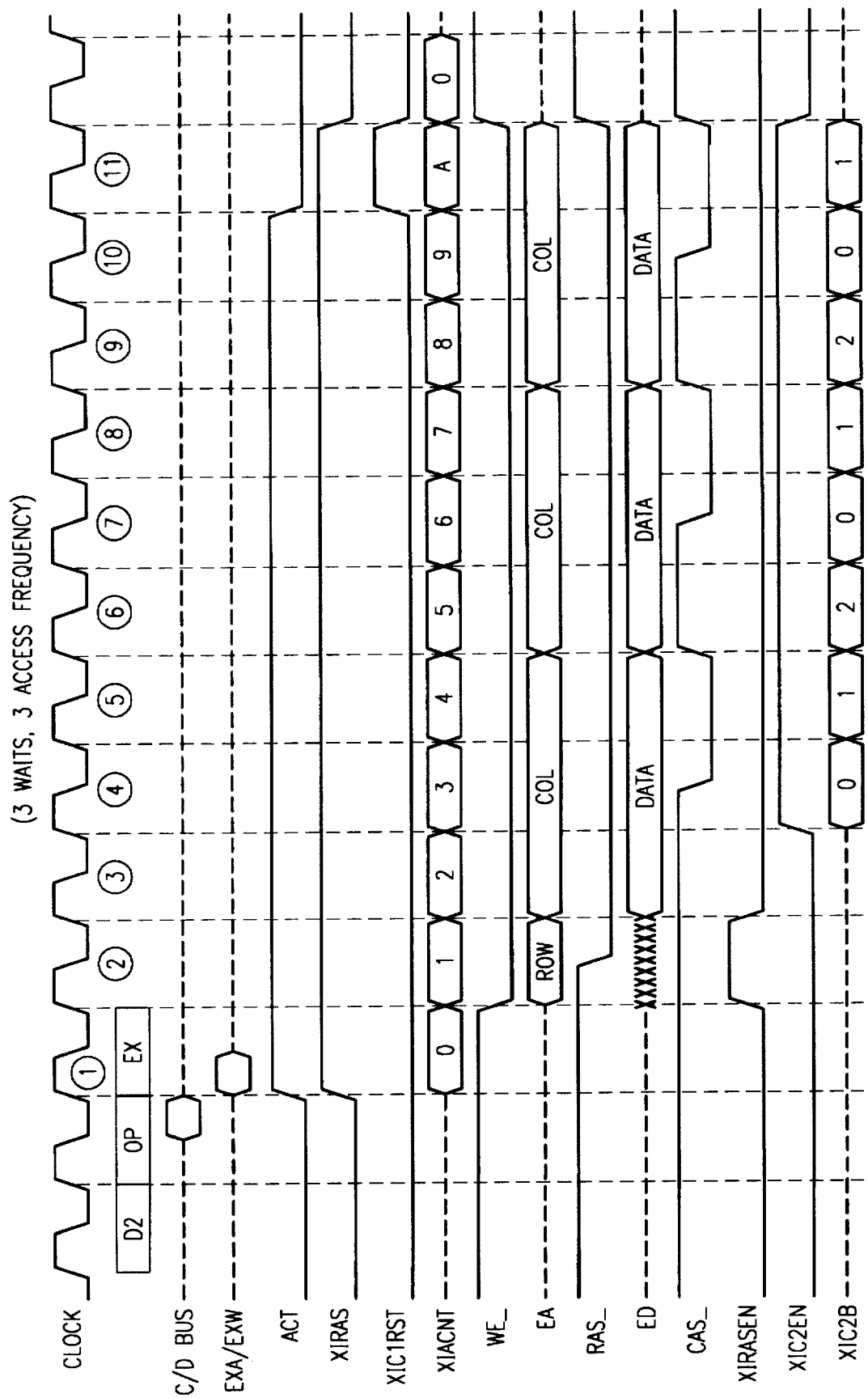
FIG. 13 is a timing chart showing the waveform or signal state of each part when write memory access is executed with (3 wait, 3 access frequency) in the embodiment.
Figure 14:
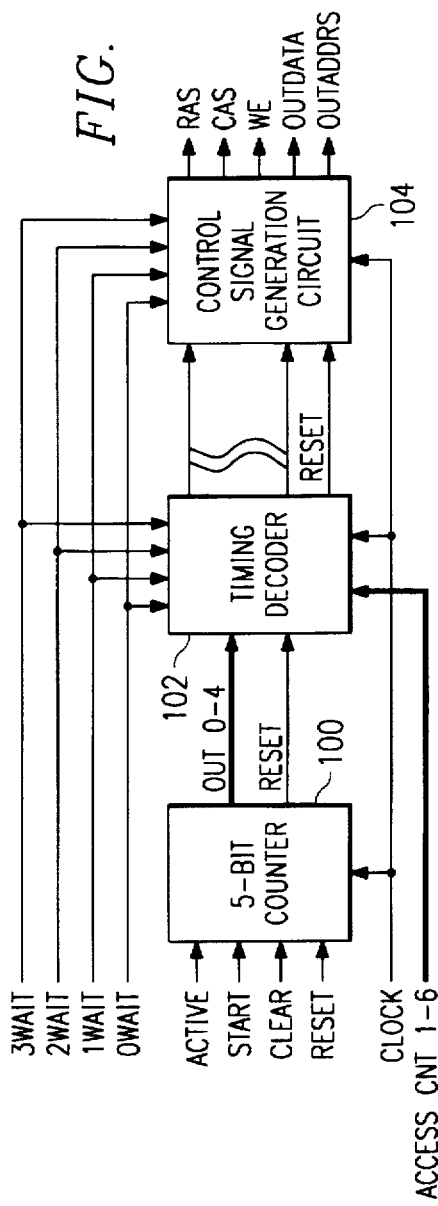
FIG. 14 is a block diagram showing the configuration of a convention programmable RAS__/CAS__ generation circuit.
Figure 15:
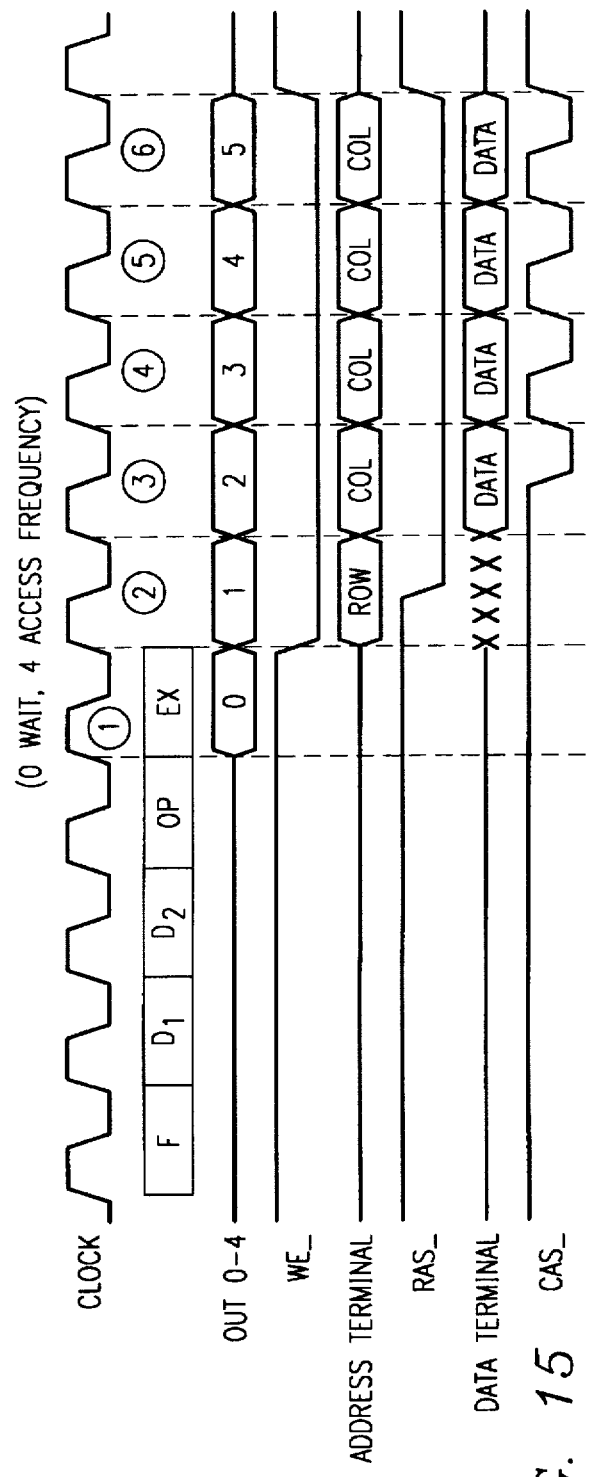
FIG. 15 is a timing chart showing the waveform and signal state of each part when write memory access is executed with 0 wait, 4 access frequency) with the programmable RAS__/CAS__ generating generating circuit in FIG. 14.
Figure 16:
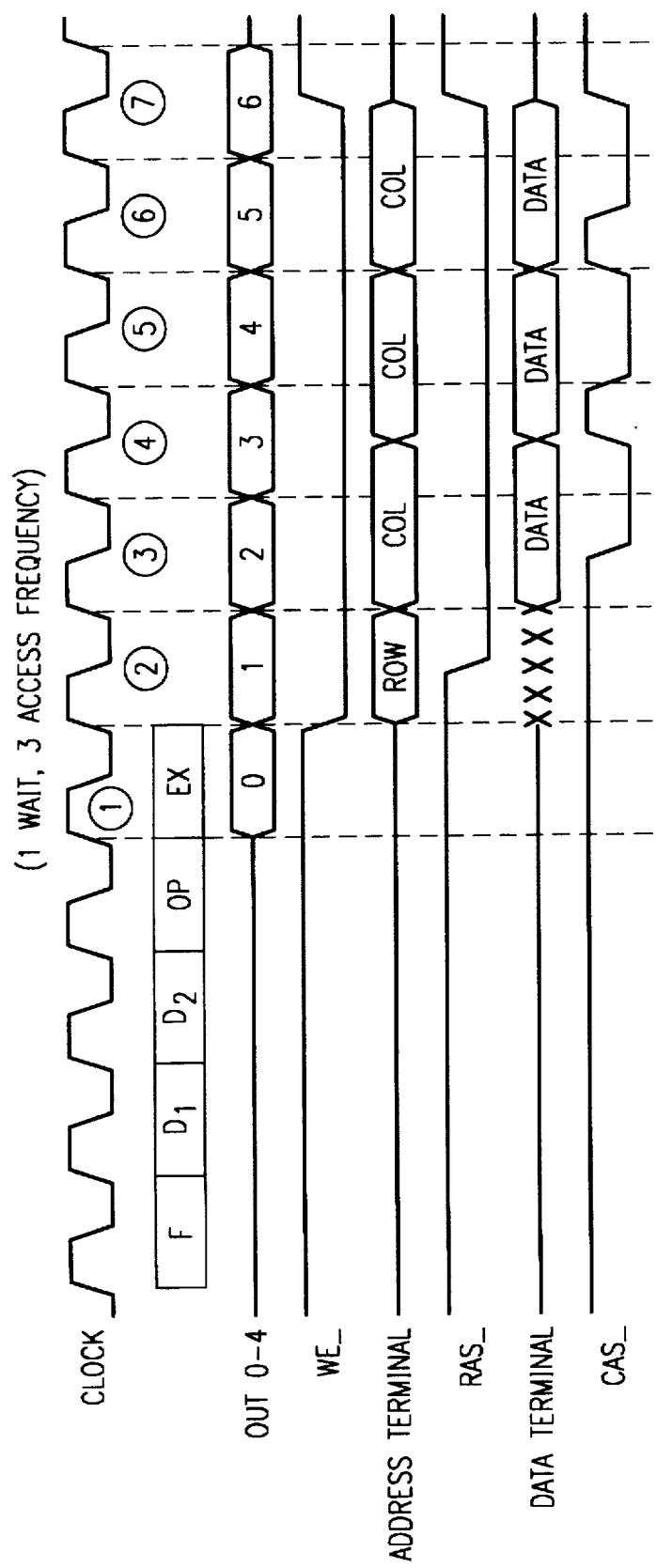
FIG. 16 is a timing chart showing the waveform or signal state of each part when write memory access is executed with (1 wait, 3 access frequency) with the programmable RAS__/CAS__ generation circuit in FIG. 14.

The operation of the programmable RAS/CAS generation circuit in write memory access with respect to external memory 36 will be explained regarding the timing FIGS. in FIGS. 9–13. FIG. 9 shows a case when the wait count is 0 and the access frequency is 6. FIG. 10 shows a case when the wait count is 1 and the access frequency is 3. FIG. 11 shows a case when the wait count is 1 and the access frequency is 4. FIG. 12 shows a case when the wait count is 2 and the access frequency is 3, and FIG. 13 shows a case when the wait count is 3 and the access frequency is 3. In each case, the length (cycle time) of the execution cycle is determined according to the table in FIG. 6.

Write instruction (WRE) with respect to external memory 36 is regulated as "WRE cma, dam." This circuit to "write the contents (data) of the memory address within D-MEM 12 specified by address (dma) in the memory address of external memory 36 specified with the content (address) of the memory address within C-MEM 10 specified with address (cma)."

When executing the external write instruction (WRE), the memory readout part of controller 30 initially reads the word of the instruction from P-MEM 32 in first cycle (F). Next, the decoder part of controller 30 decodes instruction (WRE) in decode cycle (D1,D2). PLA (programmable logic array) of controller 30 is operated based on the decode result, the necessary registers and gates are operated, and each necessary part executes the operand process and execution process.

In operand cycle (OP), address information is fed respectively to C-MEM 16 and D-MEM 18 via addressing units 17 and 19 from controller 30. Then, the address information and data read respectively from C-MEM 16 and D-MEM 18 are transferred to EX-IF 22 via C-BUS 10 and D-BUS 12 in first cycle {1} of execution cycle (EX), then loaded respectively in address register EXA within address control unit 42 and writing data register EXW within data control unit 44.

In execution cycle (EX), the memory access operation according to the page mode is executed in accordance with control signals RAS_, CAS_, WE_, OUTDATA, and OUTADDR generated from programmable RAS/CAS generation circuit (FIG. 8) within timing control unit 40.

In the case of FIG. 9 (0 wait, 6 access frequency), OUTADDRS becomes active at the same time write enable signal WE_ goes to the L level (active) at the start of second cycle {2} in execution cycle (EX), row address information (Row) of 12 bits is output from address terminal EA11-0 of address control unit 42. RAS__ goes to the L level (active) at the midway through second cycle {2}, and with this the first row address information (Row) is stored in external memory 36. Thereafter, WE__ and RAS__ are maintained in the active state (L level) until memory access is completed.

At the start of third cycle {3} in execution cycle (EX), reset signal (reset) is provided to 2-bit counter 52 from counter control circuit 50 along with count enable signal (cntenable) and CAS start signal (casstart). In the case of 0 wait mode, counter control circuit 50 maintains reset signal (reset) in the active state until memory access is completed. By it, 2-bit counter 52 operates with count loop 0 and continues to output count value 0.

Control signal generating circuit 54 initially makes CAS__ active midway through the cycle (third cycle {3}) during which count output has started from 2-bit counter 52 and decodes (monitors) count output (decode0,1,2) from 2-bit counter 52 thereafter with wait count set data (0 wait-3 wait) as the parameter. In this case, the value of count output (decode0,1,2) is (0) so control signal generating circuit 54 generates a CAS__ of the same phase (namely, the first transition and last transition are at the same timing) by synchronizing it with system clock pulse (CLOCK).

At the same time column address information (Col) of 12 bits is output from address terminal EA11-0 of address control unit 42 in synch with the logic level or waveform of CAS__, divided data (Data) is output from data terminal ED15-0 of data control unit 44, and the column address information (Col) and divided data are input into external memory 36 at the time CAS__ goes to the L level (active).

In FIG. 9 (also in FIGS. 10–13 to be discussed later), XIRAS is the signal transmitted to controller 30 from counter control circuit 50 indicating that it is midway through the pertinent instruction execution cycle and is regulating the NOP period in FIG. 7. XIRAS is the signal within control circuit 50 which regulates the execution cycle period of the pertinent instruction. XICIRST is the signal within control circuit 50 which ends the execution cycle of the pertinent instruction. XIRASEN is the signal within control circuit 50 for making the active state of RAS__ into the enable state. XIC2EN is the signal within control circuit 50 which regulates the count operation period of 2-bit counter 52. XIC2B is the value of count output (decode0,1,2) of 2-bit counter 52.

In the case of FIG. 10 (1 wait, 3 access frequency), it becomes active (L level) at the second cycle {2} in the same manner as in the case of FIG. 9 with regard to WE__ and RAS__ and is maintained thusly until memory access is completed. With regard to CAS__, count enable signal (cntenable) and CAS start signal (casstart) are provided to 2-bit counter 52 from counter control circuit 50 at the start of third cycle {3} in execution cycle (EX). In the case of 1 wait mode, count enable signal (cntenable) and count reset signal (reset) are provided repeatedly at the prescribed timing so that 2-bit counter 52 count operates with count loop (0,1,2).

Control signal generating circuit 54 makes CAS__active midway through the cycle (third cycle {3}) during which count output from 2-bit counter 52 has started and controls the logic level of CAS__ thereafter based on the value of count output (decode0,1,2) from 2-bit counter 52 with wait count set data (0 wait-3 wait) as a parameter.

In this case, the value of count output (decode0,1,2) becomes (1) in the fourth cycle {4} so the logic level of CAS__ in the fourth cycle {4} is determined from the logical product of the count output value (1) and value (1 wait) of wait count set data (0 wait-3 wait). Namely, the logic level of CAS__ has been the L level from midway through third cycle {3} but it is held at the L level even after it enters the fourth cycle {4}, goes to the H level from the L level midway through the fourth cycle {4}, then goes back to the L level (active) immediately before the end of fourth cycle {4}.

When it enters the fifth cycle {5}, the value of count output (decode0,1,2) becomes (2) and the logic level of CAS__in the fifth cycle {5} is determined from the logical product of the count output value (2) and the value (1 wait) of wait count set data (0 wait-3 wait). Namely, the logic level of CAS__ has been the L level from the end of fourth cycle {4} but stays at the L level even in the fifth cycle {5}, and goes to the H level from the L level at the end of the fifth cycle {5}.

When it enters the sixth cycle {6}, the value of count output (decode0,1,2) becomes (0) and returns to the same value as that during the third cycle {3}. In this way, control signal generating circuit 54 controls the logic level of CAS__ in the same pattern as during the third cycle {3} and changes the logic level of CAS__ to the L level (active state) from the H level midway through sixth cycle {6}. In the seventh cycle {7}, the value of count output (decode0,1,2) becomes (1) and the logic level of CAS__is controlled with the same pattern as that during the fourth cycle {4}. In this case, memory access is completed at the point in time the seventh cycle {7} ends since it has an access frequency of 3.

Even in the case of FIG. 11 (1 wait, 4 access frequency), 2-bit counter 52 operates from the third cycle {3} with count loop (0,1,2), and control signal generating circuit 54 controls the logic level or waveform of CAS__ in each cycle based on the logical product of the value (1 wait) of wait count set data (0 wait-3 wait) and the value of count output (decode0, 1,2). As a result, the access frequency, namely, the cycle time simply becomes 1 unit longer than in the case of the FIG. 10 (1 wait, 3 access frequency) and the cycle/waveform of CAS__has the same pattern along with both signals of WE__and RAS__.

In the case of FIG. 12 (2 wait, 3 access frequency), WE__ and RAS__ become active (L level) in the second cycle {2} in the same manner as in the case of the 0 wait mode and 1 wait mode and is held until memory access is completed. With regard to CAS__, count enable signal (cntenable) and CAS start signal (casstart) are provided to 2-bit counter 52 from counter control circuit 50 at the start of the fourth cycle {4} in execution cycle (EX). In the case of the 2 wait mode, count enable signal (cntenable) and count reset signal (reset) are provided repeatedly at the prescribed timing so that 2-bit counter 52 operates with count loop (0,1).

Control signal generating circuit 54 initially makes CAS__ go to the L level (active) midway through the fourth cycle {4 } during which the count output has started from 2-bit counter 52 and controls the logic level or waveform of CAS- in each cycle thereafter based on the logical product of the value (2 wait) of wait count set data (0 wait-3 wait) and the value of count output (decode0,1,2) from 2-bit counter 52.

In this case, the value of count output (decode0,1,2) becomes (1) in the fifth cycle {5} so logic level of CAS__ in the fifth cycle {5} is determined from the logical product of the count output value (1) and the value (2 wait) of wait count set data (0 wait-3 wait). Namely, the logic level of CAS__ has been the L level since midway through the fourth cycle {4} but is kept at the L level even after entering the fifth cycle {5}, and goes to the H level at the end of the fifth cycle {5}.

When it enters the sixth cycle {6}, the value of count output (decode0,1,2) becomes (0) and the logic level or waveform of CAS__ in the sixth cycle {6} is determined from the logical product of the count output value (0) and the value (2 wait) of wait count set data (0 wait–3 wait). In the sixth cycle {6}, the same logical product as that during the fourth cycle {4} is obtained so the logic level or waveform of CAS__ also has the same pattern. Namely, the logic level of CAS__ is built up from the end of the fifth cycle {5} and has been the H level since the start of the sixth cycle {6} but changes to the L level (active) midway through the sixth cycle {6} and is kept at the L level during the remainder of the sixth cycle {6}.

When it enters the seventh cycle {7}, the value of count output (decode0,1,2) becomes (1) and returns to the same value as that during the fifth cycle {5 }. In this way, control signal generating circuit 54 controls the logic level of CAS__ with the same pattern as that during the fifth cycle {5} and builds up the logic level of CAS__ from the L level to the H level at the end of the seventh cycle {7}.

Similarly, even during the eighth and ninth cycles ({8}, {9}), the same pattern as the fourth and fifth cycles ({4}, {5}) or sixth and seventh cycles {6}, {7}) is repeated. As noted above, in the 2 wait mode, 2-bit counter 52 is operated with count loop (0,1) and the logic level or waveform of CAS__ is repeated with the same pattern cyclically in synch with the counter output.

In the case of FIG. 13 (3 wait, 3 access frequency), WE__and PAS__ become active (L level) in the second cycle {2} in the same manner as in the case of each of the wait modes and are maintained until memory access is completed. With regard to CAS__, count enable signal (cntenable) and CAS start signal (casstart) are provided to 2-bit counter 52 from counter control circuit 50 at the start of the fourth cycle {4} in execution cycle (EX). In the case of the 3 wait mode, count enable signal (cntenable) and count reset signal (reset) are repeated at the prescribed timing so that 2-bit counter 52 operates with count loop (0,1,2).

Control signal generating circuit 54 initially makes CAS__ go to the L level (active) midway through the fourth cycle {4} during which the count output from 2-bit counter 52 has started and controls the logic level or waveform of CAS__ in each cycle thereafter based on the logical product of value (3 wait) of wait count set data (0 wait–3 wait) and the value of count output (decode0,1,2) from 2-bit counter 52.

In this case, the value of count output (decode0,1,2) becomes (1) in the fifth cycle {5} so the logic level of CAS__ in the fifth cycle {5} is determined from the logical product of the count output value (1) and value (3 wait) of wait count set data (0 wait–3 wait). Namely, the logic level of CAS__ has been the L level since midway through the fourth cycle {4} but it maintained at the L level even after it enters the fifth cycle {5} and builds up to the H level at the end of the fifth cycle {5}.

When it enters the sixth cycle {6 }, the value of count output (decode0,1,2) becomes (2) and the logic level or waveform of CAS__ in the sixth cycle {6} is determined from the logical product of the count output value (2) and the value (3 wait) of wait count set data. Namely, the logic level of CAS__ has built up to the H level from the end of the fifth cycle {5} to the start of the sixth cycle {6} but it is maintained at the H level throughout the entire sixth cycle {6}.

When it enters the seventh cycle {7}, the value of count output (decode0,1,2) becomes (0) and the logic level or waveform of CAS__ in the seventh cycle {7} is determined from the logical product of the count output value (0) and value (2 wait) of wait count set data (0 wait–3 wait). In the seventh cycle {7}, combination (logical product) of the count output value and the wait count set value is the same as that during the fourth cycle {4} so the logic level or waveform of CAS__ is also controlled with the same pattern. Namely, the logic level of CAS__is at the H level even at the start of the seventh cycle {7} continuing from the sixth cycle {6}, changes to the L level (active) midway through the seventh cycle {7}, and is maintained at the L level for the remainder of the seventh cycle {7}. This is the same pattern as that during the fourth cycle {4}.

In the eighth cycle {8}, combination (logical product) of count output value (1) and wait count set data (3 wait) is the same as that during the fifth cycle {5} so the logic level or waveform of CAS__ is controlled with the same pattern. Namely, the logic level of CAS__ has been the L level since midway through the seventh cycle {7} but it is maintained at the L level even after it enters the eighth cycle {8} and is built up to the H level at the end of the eighth cycle {8}.

In the ninth cycle {9}, combination (logical product) of count output value (2) and wait count set data (3 wait) is the same as that during the sixth cycle {6} so the logic level or waveform of CAS__ is controlled with the same pattern. Namely, the logic level of CAS__ is built up to the H level from the end of the eighth cycle {8} to the start of the ninth cycle {9} but it is maintained at the H level for the entire ninth cycle {9}.

Similarly, even during the tenth and eleventh cycles, the same pattern as that during the fourth and fifth cycles ({4 }, {5}) or seventh and eighth cycles ({7}, {8}) is repeated. In this way, in the three wait modes, 2-bit counter 52 operates with count loop (0,1,2) and the logic level or waveform of CAS__ is repeated with the same pattern cyclically in synch with the value of each counter output.

As noted above, in the programmable RAS__/CAS__ generation circuit according to the embodiment, 2-bit counter 52 operates with a count loop according to the wait count from a point in time (count starting point) complying with the wait count under the control of counter control circuit 50, and control signal generating circuit 54 controls the logic level or waveform of CAS__ in each cycle of execution cycle (EX) based on the logical product of the counter output value and the set wait count.

As noted above, in the memory access of the 0 wait mode, the counter output circulates with count loop (0) so the logic level or waveform of CAS__ is repeated with the same pattern in each cycle with respect to an optional access frequency.

In memory access of the 1 wait mode, counter output circulates with count loop (0,1,2) so the logic level or waveform of CAS__ is repeated with the same pattern every three cycles with respect to an optional access frequency.

In memory access of the 2 wait mode, the counter output circulates with count loop (0,1) so the logic level or waveform is repeated with the same pattern every two cycles with respect to an optional access frequency.

In memory access of the 3 wait mode, the counter output circulates with counter loop (0,1,2) so the logic level or waveform of CAS__ is repeated with the same pattern every three cycles with respect to an optional access frequency.

In this way, even if the page mode access frequency becomes high, all that is necessary is to repeat the logic level or waveform of CAS__ with a fixed pattern complying with each counter output value within the count loop for each wait mode and it is not necessary to execute decoding with a different logic for each cycle. Therefore, along with the configuration of the decode circuit becoming very simple and compact in control signal generating circuit 54, the internal bus and signal propagation time become short and the speed margin increases considerably.

The end of the execution cycle of a pertinent instruction is regulated by XIRAS, but this signal XIRAS is made to end in response to reset signal (reset) from control circuit (not shown in the FIG.) within timing control unit 40. To generate the reset signal (reset), it is possible to use a programmable counter (not shown in the FIG.) which counts the cycle time complying with the access frequency.

The example in the FIGS. 9–13 pertains to a memory access operation when executing external memory write instruction (WRE), but even when executing external memory readout instruction (RDE) which reads data from external memory 36, the logic level of write enable signal WE_ simply becomes the opposite (H level) and the other signals, in particular, RAS_ and CAS_ are controlled to be the same logic level or waveform as in the case of writing.

The 2-bit counter 52 in the embodiment is one example and as long as it is a counter which can be operated with a program controllable count loop as noted above, an optional counter can be used.

Also, the embodiment relates to a DSP for audio digital signal processing, but the programmable RAS/CAS generation circuit according to my invention is applicable also in other processors and memory controllers.

Also, in the embodiment, page mode access was executed, but my invention can be applied in other access systems, for example, nibble mode access, etc. which makes CAS_ active cyclically with RAS_ as is in the active state.

As explained above, according to the programmable RAS/CAS generation circuit of my invention, the logic level of CAS is controlled with the same pattern cyclically by variably controlling the count loop and the count starting time of the counter according to the number of waits, thus even if the access frequency is high, it can be accommodated with a simple and compact logical circuit and an increase in the speed margin and reduction in the circuit scale can be realized.

I claim:

1. A programmable RAS/CAS generation circuit comprising:

a wait count setting circuit for setting the number of waits in the memory access;

a counter for counting a prescribed clock pulse in a program controllable count loop;

a count loop control circuit for controlling the count loop of the counter according to a number of waits set by the wait count setting circuit;

a count start timing controlling circuit for controlling the timing of a count start in the counter according to the number of waits set by the wait count setting circuit;

a RAS generation circuit for maintaining the logic level of the RAS in the active state during memory access; and a CAS generation circuit (i) for controlling the logic level of the CAS during a memory access according to a value output from the counter and the number of waits set by the wait count setting circuit, and (ii) for repeating and making the CAS (column address strobe signal) active a prescribed number of times in the preset cycle with the RAS (row address strobe signal) left in the active state for memory access of a given DRAM (dynamic RAM).

* * * * *